United States Patent [19]

Tran

[11] Patent Number: 4,621,415
[45] Date of Patent: Nov. 11, 1986

[54] METHOD FOR MANUFACTURING LOW RESISTANCE SUB-MICRON GATE SCHOTTKY BARRIER DEVICES

[75] Inventor: Kim N. T. Tran, Union City, Calif.

[73] Assignee: Litton Systems, Inc., Beverly Hills, Calif.

[21] Appl. No.: 745,283

[22] Filed: Jun. 14, 1985

[51] Int. Cl.⁴ .......................................... H01L 21/441
[52] U.S. Cl. ........................................ 29/589; 29/590; 29/591; 427/88; 148/DIG. 20
[58] Field of Search ................. 29/590, 591, 578, 579, 29/589; 148/DIG. 20, DIG. 100, DIG. 106; 357/68; 427/35, 88

[56] References Cited

U.S. PATENT DOCUMENTS 4,213,840  7/1980  Omori et al. ........................ 29/578
4,253,888  3/1981  Kikuchi ..................... 148/DIG. 100

FOREIGN PATENT DOCUMENTS 93226  7/1980  Japan ..................................... 29/578
23783  3/1981  Japan ..................................... 29/591
42835  3/1985  Japan ......................... 148/DIG. 100

Primary Examiner—Aaron Weisstuch
Assistant Examiner—J. Callahan
Attorney, Agent, or Firm—Gerald L. Cline

[57] ABSTRACT

A method for manufacturing a sub-micron length Schottky barrier gate electrode. A wafer is coated with a first photoresist layer, which is exposed and developed to leave a substantially vertical line of photoresist having a sub-micron thickness. A dielectric layer is then deposited and the line of photoresist lifted off, leaving a dielectric coating layer with a sub-micron opening atop the wafer. The dielectric layer provides a mask for subsequent etching and metallization steps.

9 Claims, 8 Drawing Figures

METHOD FOR MANUFACTURING LOW RESISTANCE SUB-MICRON GATE SCHOTTKY BARRIER DEVICES

BACKGROUND

1. Field of the Invention

The present invention relates to microwave semiconductor device fabrication. More particularly, this invention pertains to a new method for manufacturing a low-resistance, low capacitance Schottky barrier gate electrode.

2. Description of the Prior Art

Gallium arsenide (GaAs) promises to play an important role in the future of semiconductor device technology. Due to its high carrier mobility (relative to silicon, among potential materials), GaAs is particularly advantageous for low noise microwave applications. Additional advantages offered by gallium arsenide devices include low power consumption, high circuit density, a wide range of operating temperatures and a high degree of radiation hardness. Numerous of these advantages are particularly useful for military applications; however, the potential range of useful applications is very wide ranging ("Gallium Arsenide Chips Emerge from the Lab", *High Technology,* Vol. 4, No. 7 (July 1984)).

The basic GaAs device geometry is the MESFET (metal semiconductor FET), although non-FET bipolar and some insulated-gate designs may emerge in the future. This basic arrangement consists of a narrow metal gate electrode placed between source and drain regions. In general, two ion-implantation doping steps are employed. One is a shallow (0.10 to 0.15 micron) implant just below the gate electrode, creating a region for source-drain current ("channel") and the other forming the source and drain regions deeper in the bulk GaAs wafer. Metal contacts to the source and drain, and to the metal gate electrode, connect the device to neighboring FETs to complete the GaAs chip's functional network. The metal gate electrode makes direct contact with the surface of the GaAs wafer, without use of an intervening insulating film, to form a Schottky junction for regulating current flow through the channel region.

The gate length of the Schottky barrier region determines the upper frequency limit of the MESFET. Sub-micron channel lengths are required for the large number of existing and contemplated devices that are capable of operating above about 8 GHz. The fabrication of such devices is complicated by the difficulties presently encountered in fabricating sub-micron length gate electrodes.

One current technique for fabricating a sub-micron length gate involves deposition of the gate metallization through a sub-micron aperture in a layer of photoresist that overlies the GaAs wafer. This technique is disclosed in U.S. Pat. No. 4,213,840 of Omori et al. for "Low-resistance, Fine-line Semiconductor Device and the Method for its Manufacture". The creation of sub-micron length Schottky gates in the above-referenced manner is complicated by the predictable amount of overdevelopment of the photoresist that is currently unavoidable. Such overdevelopment of the layer, done for the purpose of assuring the removal of all of the exposed photoresist material forming the sub-micron line, makes it exceedingly difficult to control the sub-micron length of a gate formed in such a manner. Further, subsequent lift-off of the metallization on top of the photoresist adjacent the submicron opening cannot occur cleanly unless the photoresist layer is relatively "thin" (about 5000 Angstroms). This requirement limits the thickness (and, hence, the conductivity) of the metallization layer applied in this step.

Buiatti, U.S. Pat. No. 4,048,712 for "Processes for Manufacturing Semiconductor Devices" discloses a chemical underetching process for manufacturing a gate for a MESFET. As taught in that patent, 1 or 2 microns of underetching may be done to produce a gate electrode of about 3 microns in length.

SUMMARY OF THE INVENTION

The present invention overcomes the aforesaid and additional shortcomings of the prior art by providing a new method for fabricating a Schottky gate electrode on a planar semiconductor wafer. This fabrication method is begun by depositing a first photoresist layer directly on the upper surface of the planar semiconductor wafer. Thereafter, a substantially vertical line of predetermined thickness is photolithographically defined within the layer of photoresist and the remainder of the layer removed whereby the substantially vertical line of photoresist overlies a preselected area of the wafer. Then, a dielectric layer is deposited. This is followed by the removal of the substantially vertical line of photoresist with the portion of the dielectric layer thereon whereby the preselected area of the upper surface of the wafer is exposed through an opening in the dielectric layer. A second photoresist layer is then deposited. A substantially vertical area of the second photoresist layer is then photolithographically defined which overshadows the preselected area of the wafer, and this area is removed to create an enlarged aperture in the second photoresist layer. The surface of the wafer is next etched at the preselected area. A metallic layer is then deposited. Finally, the remainder of the second photoresist layer and the portion of the metal layer thereon are removed to form the Schottky gate electrode.

The foregoing and additional advantages and features of this invention will become apparent from the detailed description that follows. This description is accompanied by a set of drawing figures. Like numerals of the drawing figures and of the detailed written description correspond to like features of this invention throughout.

DETAILED DESCRIPTION

Figure 1A:
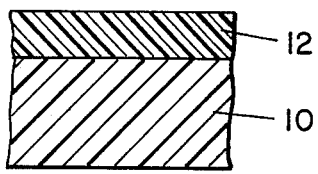
FIGS. 1(a) through 1(g), inclusive, are cross-sectional illustrations of the sequence of fabrication steps of the gate electrode of a FET in accordance with the invention.

Referring now to the drawings, the process of the invention for fabricating a Schottky gate FET is sequentially illustrated in FIGS. 1(a) through 1(g). As will be seen, the gate comprises a metal structure which contacts an underlying wafer 10 of GaAs material. Prior to formation of the gate and other overlying structures, the wafer 10 may undergo a number of processing steps for forming electrically functional regions therein. Procedures including, but not limited to, epitaxial layer growth and the like may be employed. The wafer 10, as prepared, may include a number of regions of varying conductivity. Its innermost portion comprises a semi-insulating substrate. Adjacent this is an undoped, high resistivity, buffer region and, overlying this, an n-type active region. A heavily doped ohmic contact layer covers the entire wafer 10. Each of the latter regions may be formed by molecular beam epitaxial deposition.

Figure 1B:
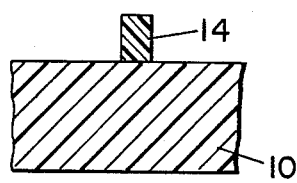
Figure 1C:
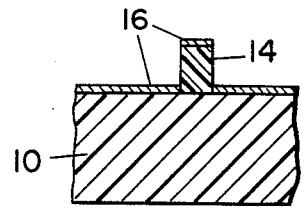
Figure 1D:
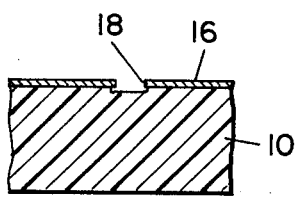

Following preparation of the wafer 10, a first layer 12 of positive photoresist is deposited or spun onto the upper surface of the wafer 10. The first photoresist layer 12, having a thickness of about 8000 Angstroms, is exposed by conventional photolithographic techniques, such as contact printing, to define a substantially vertical submicron-thick "line" (about 5000 Angstroms) that overlies a preselected (channel) region of the wafer 10. The exposed portions of the positive photoresist layer 12 are then removed, leaving the sub-micron thick line 14 atop the wafer 10 as shown in FIG. 1(b). (The views of the figures are greatly exaggerated for ease of illustration.) Unlike prior art processes such as that of U.S. Pat. No. 4,213,840, the sub-micron width of the photoresist line 14 of the first layer is reliably readily achieved by conventional photolithographic processes and not subject to the problems resulting from overexposure and overdevelopment of processes wherein a sub-micron segment is removed from a photoresist layer.

A dielectric layer 16 is next deposited on top of the wafer 10 and the substantially vertical line of photoresist 14. The dielectric layer 16, preferably about 1000 Angstroms thick, may comprise aluminum oxide, silicon oxide or the like. The layer 16 may be appropriately deposited by conventional low pressure (0.0000001–0.00000001 Torr) E-beam evaporation. The rate of deposition of the oxide (about 1.2–1.5 Angstroms per second) is controlled so that a temperature of ninety degrees Centigrade is not exceeded at the surface of the wafer 10. The wafer 10 is then put into an acetone bath that attacks the photoresist material, which may then be lifted off along with the overlying dielectric layer, leaving the wafer 10 with a dielectric layer 16 atop having a sub-micron wide aperture 18 therein. The aperture 18 (i.e. exposed portion of the surface of the wafer 10) overlies a preselected FET Schottky barrier region of the wafer 10.

A second positive photoresist layer 20 is now applied. This second layer is thicker than the first photoresist layer, about 1.5 microns. As will be seen, the additional thickness of the second layer 20 permits the subsequent liftoff of a thick layer of metallization, minimizing the electrical resistance of the resulting gate electrode structure.

An aperture 22 is formed in the second photoresist layer 20 by conventional optical lithography. The aperture is enlarged (about 1 micron wide) with respect to, and overshadows the aperture 18 in the dielectric layer 16; hence, it overlies the predetermined Schottky barrier region of the wafer 10.

Figure 1E:
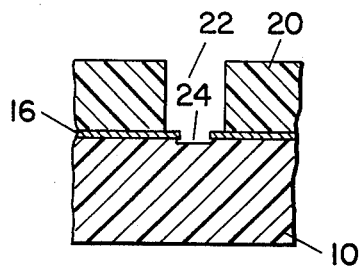

As is shown in FIG. 1(e), after the wafer has been removed from an alkali solution for developing the second photoresist layer 20, the surface of the wafer 10 is etched to a depth of about 500 Angstroms by means of an appropriate GaAs etchant, such as phosphoric acid, perchloric acid, a mix of ammonium hydroxide, hydrogen peroxide and water, or the like. The dielectric layer 16 provides a mask for this recess etch. The resulting depression 24 in the surface of the wafer 10 serves to reduce the gate-to-drain breakdown voltage of the FET.

Figure 1F:
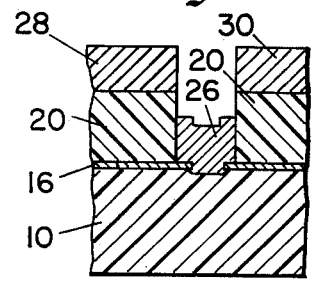

A layer of metallization is next deposited atop the structure. As can be seen in FIG. 1(f), portion 26 of the metallization is situated atop, and in direct contact with, the wafer 10 whereas portions 28 and 30 on either side thereof lie atop the now discontinuous second photoresist layer 20.

The layer of metallization comprises, in a preferred embodiment, layers of titanium, platinum and gold formed by successive E-beam depositions. The titanium layer, a few hundred Angstroms thick, contacts the wafer 10 and forms a Schottky barrier therewith at the base portion of the gate. Numerous other materials may be advantageously employed for this purpose, including tungsten, molybdenum, platinum, palladium, aluminum, chromium, hafnium and selected alloys of these metals.

Platinum is deposited to a depth of a few hundred Angstroms atop the titanium. This acts as a barrier layer within the gate. Finally, gold is deposited atop the platinum so that the thickness of the composite metallization layer is about 5000 Angstroms. As in the case of the dielectric layer 16, the E-beam depositions are conducted in a vacuum of about 0.000001 to 0.00000001 Torr at rates that permit good deposition quality without heating the surface of the wafer 10 above 90 degrees Centigrade. This condition has been satisfied by rates of 3–5 (titanium), 1–2 (platinum) and 4–5 (gold) Angstroms per second.

Figure 1G:
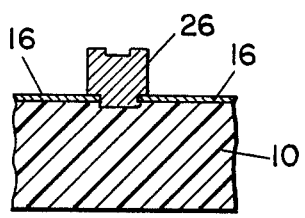

The wafer 10 is again immersed in an acetone bath that attacks the undeveloped photoresist and the resist is removed along with the overlying portions 28 and 30 of the metallization in a lift-off step. As shown in FIG. 1(g) the somewhat Y-shaped portion 26 of the metallization layer remains, forming the Schottky barrier gate-electrode on the wafer 10. A narrow base portion of the Y-shape of sub-micron gate length contacts the GaAs wafer and forms a Schottky barrier therewith. The electrode, having a height of about 5000 Angstroms, includes a large proportion of highly conductive gold to minimize gate resistance. Gate resistance is further minimized by the y- or t-shaped cross-sectional geometry of the gate which creates a relatively large cross-sectional area above the sub-micron portion of the length of the gate that contacts the wafer 10 for increasing gate conductivity.

Figure 2:
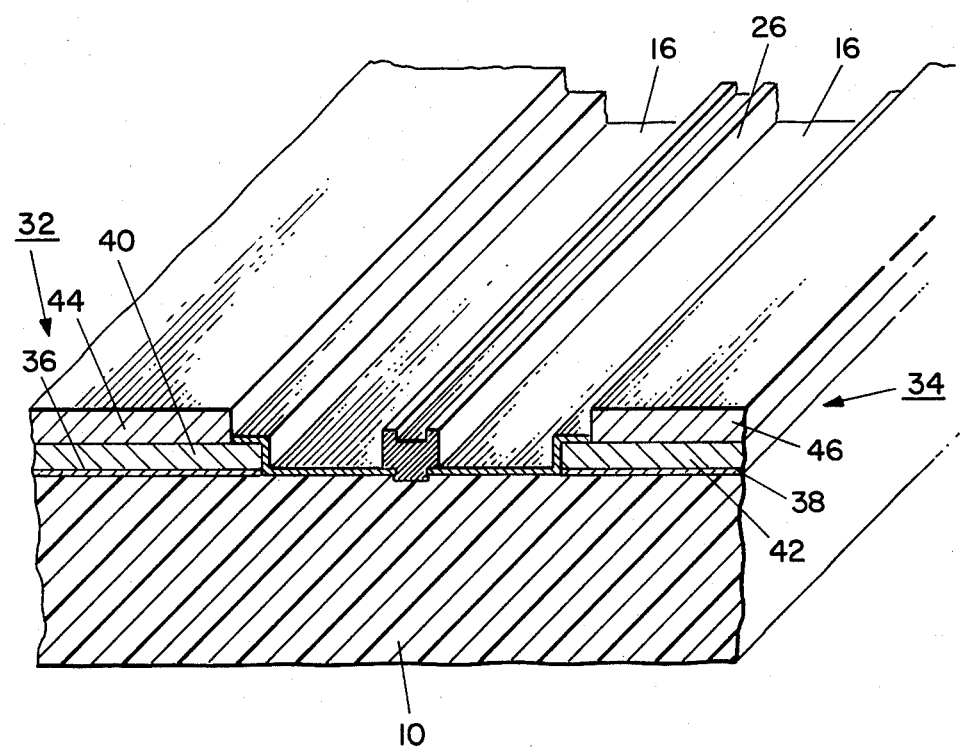
FIG. 2 is a sectional perspective view of the source, gate and drain structures of a FET manufactured in accordance with the method of the invention.

FIG. 2 is a cross-sectional and perspective view of a GaAs FET, including drain 32 and source 34 electrodes in addition to a gate electrode 26 formed in accordance with the invention. Numerals corresponding to those utilized in FIGS. 1(a) through 1(g) identify structures also disclosed in that sequence. The gate electrode 26 along with the source and drain electrodes may comprise strips some hundreds of microns in width, as indicated by the depth of the view of FIG. 2. As in FIGS. 1(a) through (1g), the view of FIG. 2 is not to scale. The process of the invention may be utlized to provide metallic overlays 44 and 46 for the source and drain electrodes respectively and thereby reduce the electrical resistances of these elements of the completed FET.

As seen in FIG. 2, the FET includes source and drain ohmic contact metallizations 40 and 42 formed prior to the formation of the gate electrode 26 by known techniques such as optical lithography followed by successive depositions of appropriate materials. After removal of the photoresist and heating to alloy and aneal the metallizations 40 and 42, they form a mask for preferential etching of the highly doped layer, leaving the ohmic contacts 36 and 38.

Referring back to the sequence of steps of the invention as shown in FIGS. 1(a) through 1(g) and applying it to the structure of FIG. 2, the metallic overlays 44 and 46 of the drain and source electrodes are readily formed as the gate electrode 26 is formed. The first photoresist layer 12 crosses both metallization 40 and 42 in additon to the channel area of the wafer 10. Just as the layer 12 is patterned to define the substantially vertical line 14, it is similarly patterned at its edges atop the source mertallization 40 and the drain metallization 42. Thus, when the first photoresist layer 12 is developed, strips of photoresist remain atop these metallizations just as the line 14 remains atop, and in direct contact with, the wafer 10. When the dielectric layer 16 is next deposited, edge portions of the layer 16 directly cover the exposed "shoulders" of the metallizations 40 and 42 and the portions of the first photoresist layer 12 covering the remainder of the metallizations 40 and 42. The latter photoresist-and-dielectric layer is removed in the liftoff step of FIG. 1(d). The second layer of photoresist 20 is then applied and exposed with masking of opposite polarity to that used for exposure of the first photoresist layer, and removed. This latter step (corresponding to the view of FIG. 1(e)) leaves the portions of the metallizations 40 and 42, that are not covered with the dielectric layer 16, exposed at the same time the aperture 22 is opened in the second photoresist layer 20.

The exposed portions of the upper surfaces of the metallizations 40 and 42 are built up during the metallization of the gate electrode as shown in FIG. 1(f). After liftoff of the second photoresist layer 20, metallic overlays 44 and 46 remain atop the source and drain metallizations 40 and 42 respectively. With reference to FIG. 1(e), the overlay 44 is seen to be formed from the portion 28 of the gate metallization layer and the overlay 46 is formed from the portion 30 of that metallization layer. While the view of FIG. 2 is not to scale, including, for example, greatly exaggerated electrode spacings, one can see that the source 32 and drain 34 electrodes may be readily built up during the formation of a gate electrode in accordance with this invention.

Thus is it seen that there has been brought to the microwave semiconductor fabrication art a new method for manufacturing a Schottky barrier gate electrode. By employing the method of this invention one may readily and reliably achieve low resistance submicron gate lengths that minimize undesired capacitances and enhance upper frequency limits.

While this invention has been described with reference to its presently preferred embodiment, it is by no means limited thereto. Rather the invention is only to be limited as defined in the following set of claims and all equivalents thereof.

What is claimed is:

1. A method for fabricating a Schottky gate electrode on a planar semiconductor wafer comprising the steps of:
   (a) depositing a first photoresist layer directly on the upper surface of said planar semiconductor wafer; then
   (b) photolithographically defining a substantially vertical line of predetermined thickness within said layer and removing the remainder of said first photoresist layer whereby said substantially vertical line of photoresist overlies a preselected area of said wafer; then
   (c) depositing a dielectric layer; then
   (d) removing said vertical line of photoresist and the portion of said dielectric layer thereon whereby the preselected area of the upper surface of said wafer is exposed through an opening in said dielectric layer; then
   (e) depositing a second photoresist layer; then
   (f) photolithographically defining a substantially vertical area of said second photoresist layer which overshadows said preselected area and removing said defined area to create an enlarged aperture in said second photoresist layer; then
   (g) etching the surface of said wafer at said preselected area; then
   (h) depositing a metallic layer on said second photoresist layer and said preselected area; and then
   (i) removing the remainder of said second photoresist layer and the portion of the metal thereon.

2. A method as defined in claim 1 wherein said second photoresist layer is thicker than said first photoresist layer.

3. A method as defined in claim 2 wherein said substantially vertical line of photoresist is less than 1 micron thick.

4. A method as defined in claim 3 wherein the etching step is further characterized by using said dielectric layer as a mask therefor.

5. A method as defined in claim 4 wherein the dielectric layer is deposited by E-beam deposition.

6. A method as defined in claim 5 wherein said metallic layer is deposited by E-beam deposition.

7. A method as defined in claim 1 wherein said metallic layer is approximately 5000 Angstroms thick.

8. A method as defined in claim 1 wherein said enlarged aperture is approximately 1 micron wide.

9. A gate electrode as defined in claim 1 further characterized in that the region of contact between said electrode and said wafer is less than 1 micron.

* * * * *